(12) United States Patent
Choi et al.

(10) Patent No.: US 7,833,029 B2
(45) Date of Patent: Nov. 16, 2010

(54) WIRELESS COMMUNICATION TERMINAL WITH A COVER MOVING IN CONJUNCTION WITH A CONNECTOR UNIT TO OPEN AND CLOSED POSITIONS

(75) Inventors: Dong-Chol Choi, Seoul (KR); Duck-Hyun Kim, Seoul (KR); Ki-Won Lee, Seoul (KR); Bong-Kyu Lee, Seoul (KR)

(73) Assignee: Pantech Co., Ltd., Seoul (KR)

( * ) Notice: Subject to any disclaimer, the term of this patent is extended or adjusted under 35 U.S.C. 154(b) by 0 days.

(21) Appl. No.: 12/556,366

(22) Filed: Sep. 9, 2009

(65) Prior Publication Data
US 2010/0221937 A1 Sep. 2, 2010

(30) Foreign Application Priority Data
Feb. 27, 2009 (KR) .................. 10-2009-0017078

(51) Int. Cl.
*H01R 13/44* (2006.01)
(52) U.S. Cl. .................................................. 439/135
(58) Field of Classification Search ............. 439/135, 439/142, 131, 134, 133, 140, 141, 367
See application file for complete search history.

(56) References Cited

U.S. PATENT DOCUMENTS

| | | | | |
|---|---|---|---|---|
| 2,984,808 A * | 5/1961 | Bender | ...................... | 439/104 |
| 3,727,174 A * | 4/1973 | Podmore et al. | ............ | 439/596 |
| 4,379,607 A * | 4/1983 | Bowden, Jr. | ................ | 439/137 |
| 6,419,504 B1 * | 7/2002 | Nelson | ........................ | 439/103 |
| 6,422,880 B1 * | 7/2002 | Chiu | .......................... | 439/137 |
| 6,749,451 B2 * | 6/2004 | Schmitt | ...................... | 439/218 |
| 2005/0106910 A1* | 5/2005 | Chiu | .......................... | 439/136 |
| 2007/0123089 A1* | 5/2007 | Nishio et al. | ................ | 439/342 |

* cited by examiner

*Primary Examiner*—Chandrika Prasad
(74) *Attorney, Agent, or Firm*—H.C. Park & Associates, PLC

(57) ABSTRACT

A wireless communication terminal includes a terminal body having an arrangement portion, a connector unit hinge-connected to the terminal body and able to be accommodated in and taken out of the arrangement portion, a cover unit to move on the terminal body to cover and uncover the arrangement portion, and a guide unit to hold the cover unit in an open position, and to guide the cover unit into a closed position in conjunction with a movement of the connector unit. The cover unit includes an embedded antenna, and the connector unit includes a Universal Serial Bus (USB) connector to provide a wireless communication function.

14 Claims, 8 Drawing Sheets

WIRELESS COMMUNICATION TERMINAL WITH A COVER MOVING IN CONJUNCTION WITH A CONNECTOR UNIT TO OPEN AND CLOSED POSITIONS

CROSS-REFERENCE TO RELATED APPLICATION

This application claims priority from and the benefit of Korean Patent Application No. 10-2009-0017078, filed on Feb. 27, 2009, which is hereby incorporated by reference for all purposes as if fully set forth herein.

BACKGROUND OF THE INVENTION

1. Field of the Invention

Exemplary embodiments of the present invention relate to a wireless communication terminal, and more particularly, to a wireless communication terminal having a connector unit and a cover unit that moves in conjunction with a movement of the connector unit, and a guide unit thereof.

2. Discussion of the Background

In general, a wireless communication terminal may be a portable device capable of wirelessly transmitting and/or receiving a signal. The wireless communication terminal may include a personal communication service (PCS) terminal, a personal digital assistant (PDA), a Smart phone, a portable multimedia player (PMP), a wireless Local Area Network (WLAN) terminal, and the like. Additionally, a wireless communication terminal may be connected to a computer such as a laptop to provide a wireless Internet connection for the computer.

An antenna may be mounted in the wireless communication terminal to wirelessly transmit/receive a signal. Currently, an internal embedded intenna may be used to improve portability. Also, a connector such as a Universal Serial Bus (USB) connector may be included in the wireless communication terminal to connect to the computer.

However, this type of wireless communication terminal has become smaller to enhance portability, and so a radial pattern of the intenna has become more and more limited. That is, an appropriate size and thickness of the wireless communication terminal may be selected to achieve any one of a variety of radial patterns of the intenna.

Also, the connector protrudes from the wireless communication terminal to connect to a computer, and this may cause user inconvenience, or the connector may be damaged in its protruded condition.

SUMMARY OF THE INVENTION

Exemplary embodiments of the present invention provide a wireless communication terminal having a connector unit and a cover unit that moves in conjunction with a movement of the connector unit, and a guide unit thereof.

Exemplary embodiments of the present invention also provide a wireless communication terminal and a guide unit thereof that may permit a more varied radial pattern of an intenna.

Additional features of the invention will be set forth in the description which follows, and in part will be apparent from the description, or may be learned by practice of the invention.

An exemplary embodiment of the present invention discloses a wireless communication terminal including a terminal body, a cover unit arranged to move on the terminal body, a connector unit arranged to move on the terminal body, a first guide unit to guide the cover unit to move from a closed position to an open position, and a second guide unit to hold the cover unit in the open position, and to release the cover unit held in the open position in conjunction with movement of the connector unit.

An exemplary embodiment of the present invention also discloses a wireless communication terminal including a terminal body, a cover unit arranged to move on the terminal body, a connector unit arranged to move from a first acceptance space on the terminal body to a release position, and a guide unit to guide the cover unit to move from a closed position to an open position, and to hold the cover unit in the closed position and the open position, the closed position being a position where the cover unit covers the connector unit in the first acceptance space, and the open position being a position where the connector unit is uncovered.

An exemplary embodiment of the present invention also discloses a wireless communication terminal including a terminal body having an arrangement portion, a connector unit hinge-connected to the terminal body, the connector unit to move into and out of the arrangement portion, a cover unit to move on the terminal body, the cover unit to partially cover the arrangement portion if the cover unit is in a closed position, and a guide unit to hold the cover unit in an open position, and to guide the cover unit to the closed position in conjunction with a movement of the connector unit into the arrangement portion.

An exemplary embodiment of the present invention also discloses a guide unit, including a first unit, and a second unit. The first unit, partially arranged in a terminal body and partially overlapping with the second unit, automatically moves along the terminal body in conjunction with a movement of the second unit into the terminal body.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
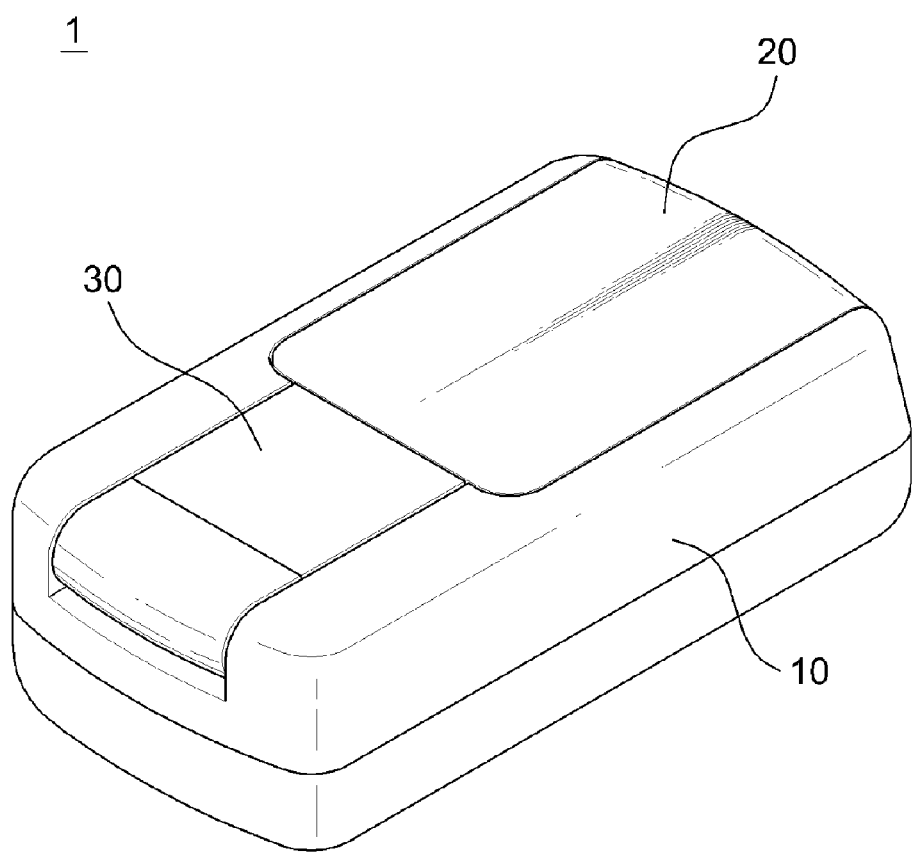
FIG. 1 is a perspective view illustrating a wireless communication terminal according to an exemplary embodiment of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element is referred to as being "connected to" another element, it can be directly connected to the other element, or intervening elements may be present.

Figure 2A:
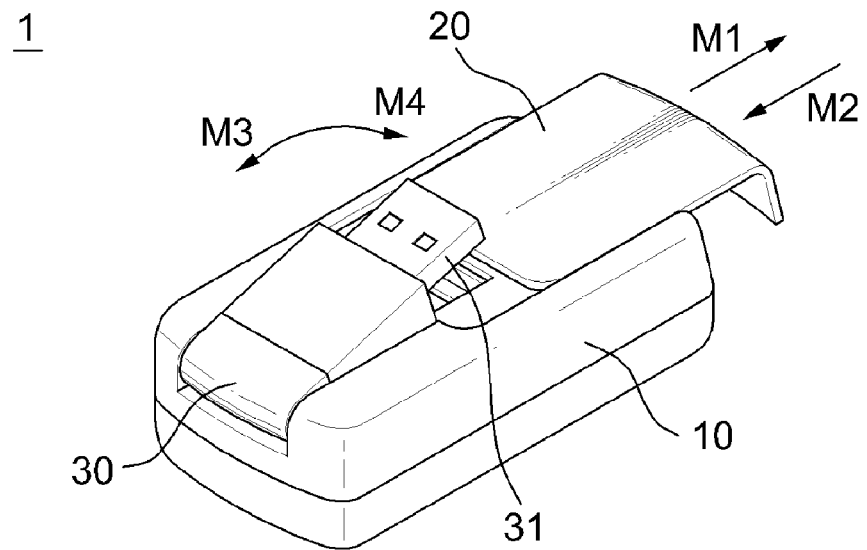
FIG. 2A, FIG. 2B, and FIG. 2C are perspective views illustrating an operation of the wireless communication terminal of FIG. 1 as a cover unit moves to an open position.
Figure 2B:
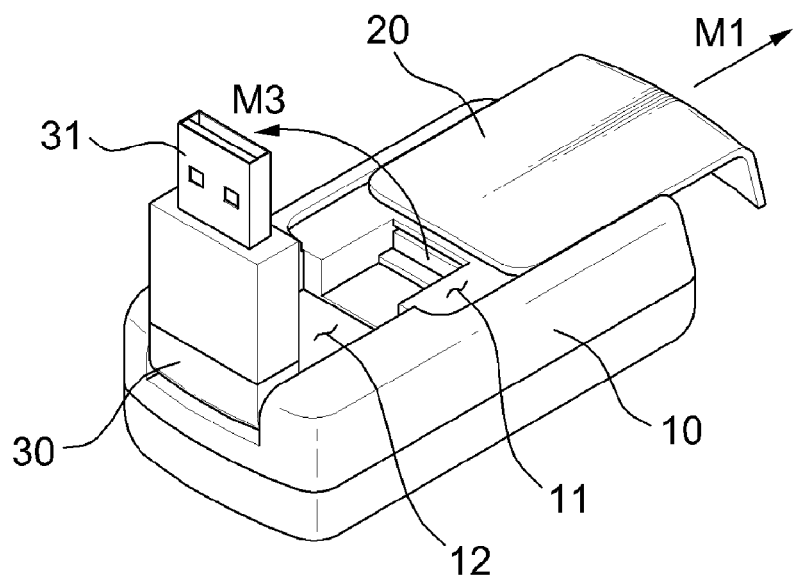
Figure 2C:
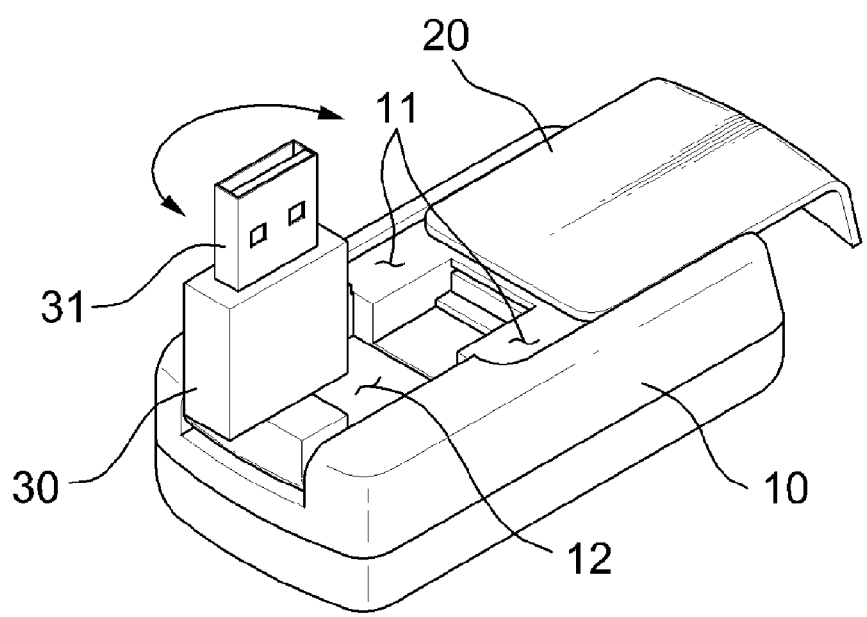
Figure 3:
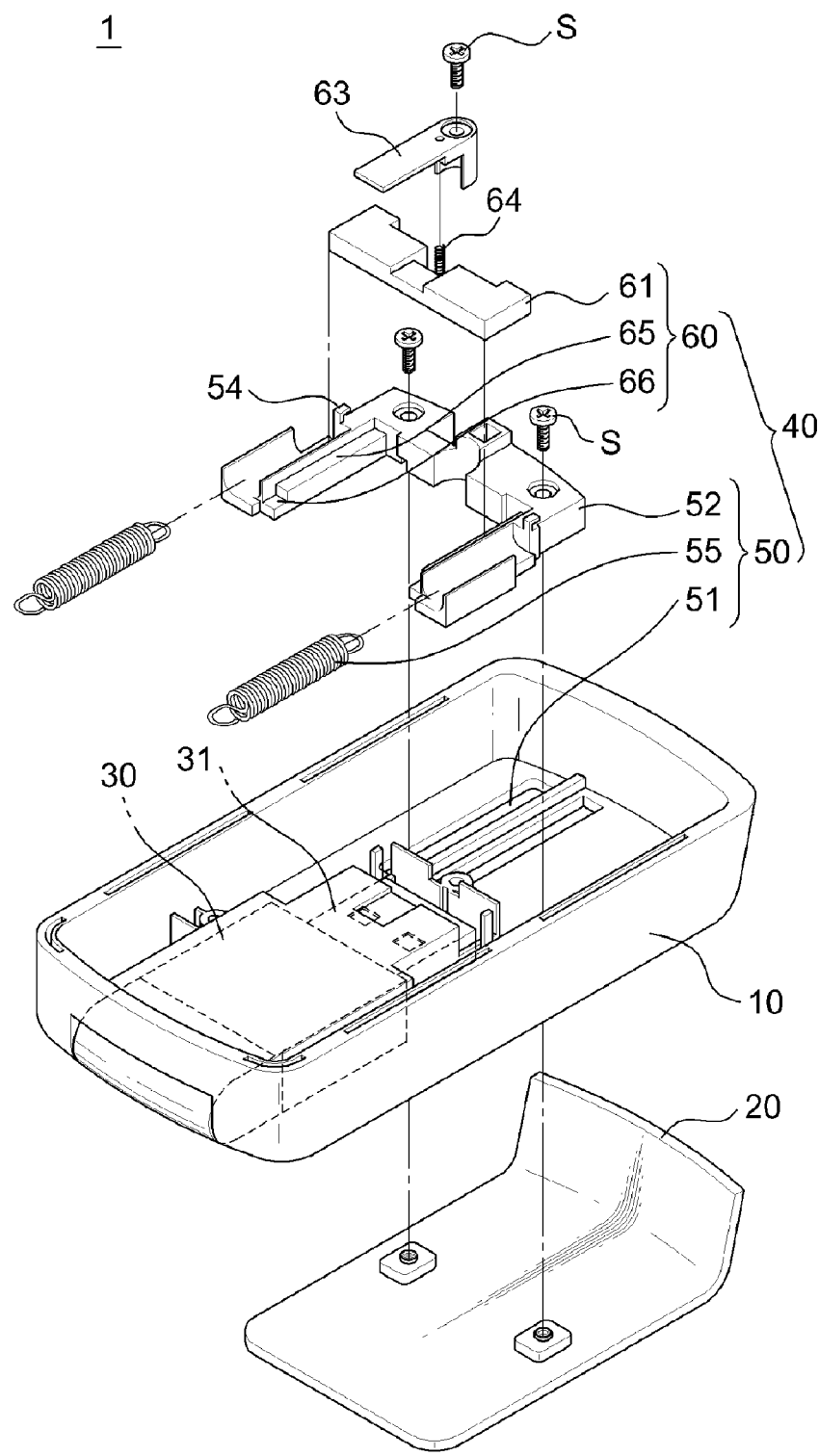
FIG. 3 is an exploded perspective view of the wireless communication terminal of FIG. 1.
Figure 4:
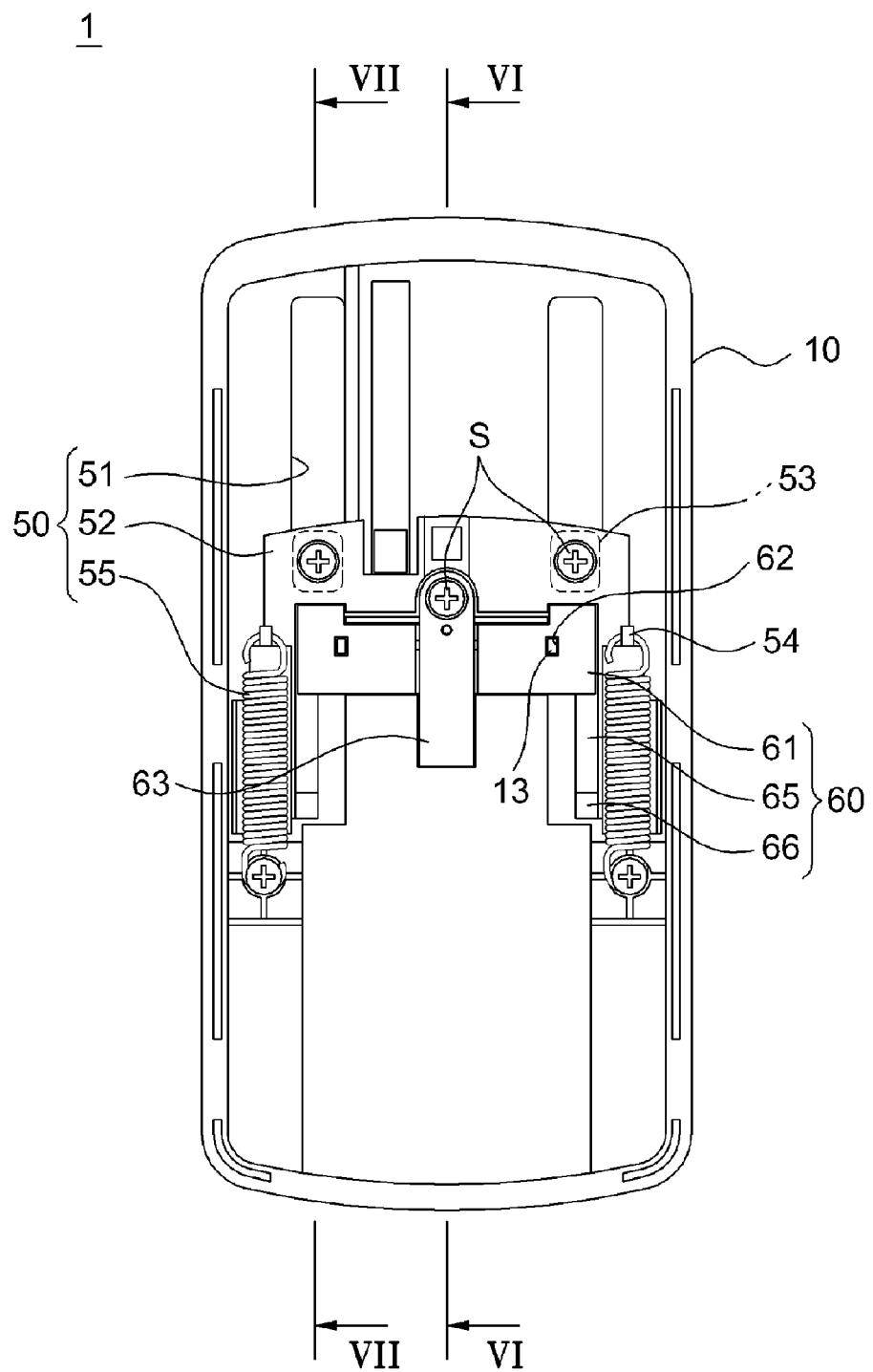
FIG. 4 is a diagram illustrating a guide unit if a cover unit is in a closed position.
Figure 5:
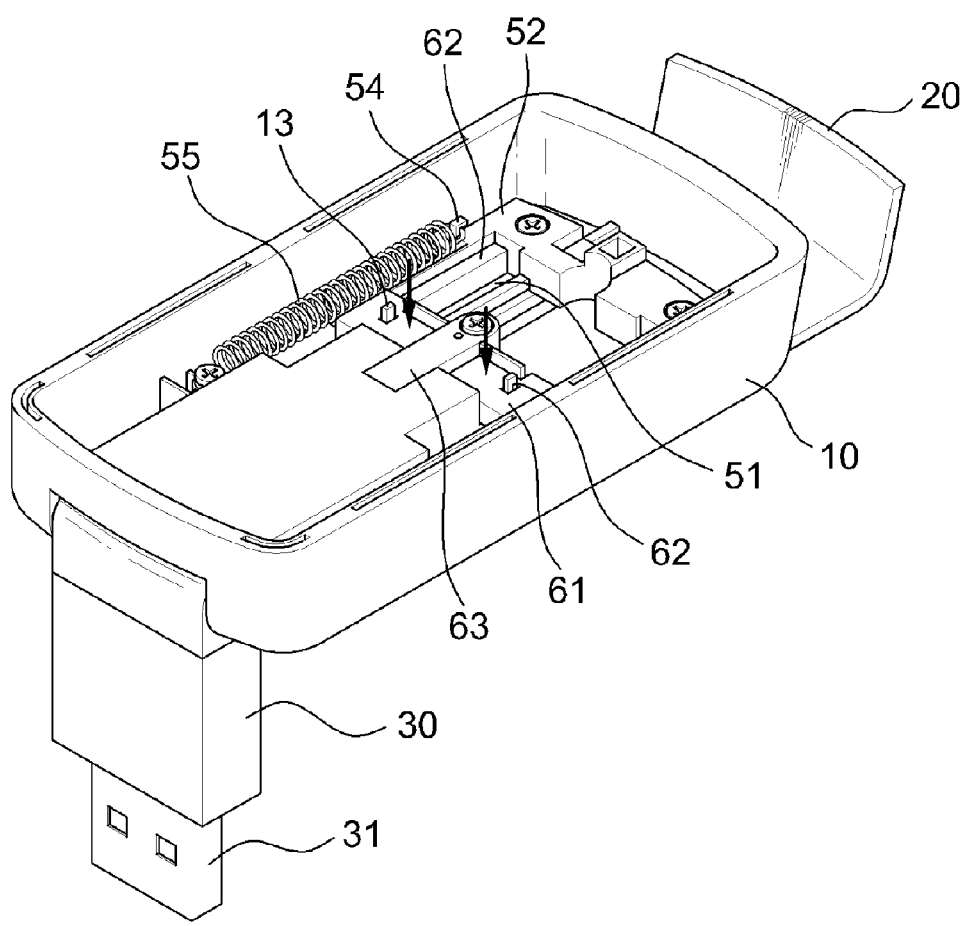
FIG. 5 is a diagram illustrating a guide unit if a cover unit is in an open position.

FIG. 1 is a perspective view illustrating a wireless communication terminal according to an embodiment of the present invention. FIG. 2A, FIG. 2B, and FIG. 2C are perspective views illustrating an operation of the wireless communication terminal of FIG. 1 as a cover unit moves to an open position. FIG. 3 is an exploded perspective view of the wireless communication terminal of FIG. 1. FIG. 4 is a diagram illustrating a guide unit if a cover unit is in a closed position. FIG. 5 is a diagram illustrating a guide unit if a cover unit is in an open position.

Referring to FIG. 1, FIG. 2A, FIG. 2B, FIG. 2C, FIG. 3, FIG. 4, and FIG. 5, a wireless communication terminal 1 includes a terminal body 10, a cover unit 20, a connector unit 30, and a guide unit 40. The wireless communication terminal 1 may be a wireless communication terminal which is able to be connected to a computer, such as a laptop computer, and may provide a wireless Internet connection for the computer.

As illustrated in FIG. 1, the terminal body 10 may be a body of the wireless communication terminal 1. An arrangement portion in the terminal body 10 may include a first arrangement space 11 and a second arrangement space 12 which partially overlap with each other. The cover unit 20 and the connector unit 30 may be arranged in the arrangement portion in the terminal body 10, as illustrated in FIG. 2A, FIG. 2B, and FIG. 2C. The cover unit 20 and the connector unit 30 may partially overlap with each other in the terminal body 10. Specifically, in one arrangement, the cover unit 20 and the connector unit 30 may both be arranged in the arrangement portion included in the terminal body 10.

Although not shown, other components for wireless communication, for example, a control board to process a transmitted/received radio signal, may be mounted in the terminal body 10. To avoid confusion, detailed descriptions related to these components will be omitted since they are well-known to those skilled in the related art.

As illustrated in FIG. 1 and FIG. 2, the cover unit 20 may be arranged in the first arrangement space 11 of the terminal body 10, and may move between an open position and a closed position. The open position may be a position where at least a portion of the first arrangement space 11 is uncovered, and the closed position may be a position where the first arrangement space 11 is partially or entirely covered. The direction of movement of the cover unit 20 may be in a length direction of the terminal body 10, illustrated as an M1 direction and an M2 direction in FIG. 2A and FIG. 2B.

Specifically, the cover unit 20 may slide in an M1 direction illustrated in FIG. 2A and FIG. 2B from the closed position to the open position. Similarly, the cover unit 20 may slide in an M2 direction illustrated in FIG. 2A and FIG. 2B from the open position to the closed position. However, the cover unit 20 may be moved from the closed position to the open position in other manners, such as by being rotated, slid in a width direction of the terminal body 10, or a combination of sliding and rotating.

Although not shown in detail, an intenna may be embedded in the cover unit 20. The intenna may form a predetermined radial pattern and wirelessly transmit and/or receive a signal. An intenna is an embedded antenna, which may be structured to maintain a characteristic of an antenna without a separate portion protruding from the components of the wireless communication terminal 1. The intenna may permit the wireless communication terminal 1 to be relatively small-sized, and may prevent or reduce unnecessary or undesirable electromagnetic waves from occurring.

Accordingly, if the cover unit 20 is in the open position as illustrated in FIG. 2A and FIG. 2B, the intenna embedded in the cover unit 20 may form more various radial patterns than when the cover unit 20 is arranged in the closed position. That is, the cover unit 20 may slide to an open position regardless of the terminal body 10 size and thickness, and thus the radial pattern may be more varied.

The connector unit 30 may also move relative to the terminal body 10. A USB connector 31 capable of being connected to a computer or other USB-compatible device may be included in the connector unit 30. The connector unit 30 may move between a holding position and a release position. As illustrated in FIG. 1, the connector unit 30 may be arranged in the second arrangement space 12 of the terminal body 10 in the holding position, and may be restrained from moving into the release position by the cover unit 20 in the closed position. As illustrated in FIG. 2A, FIG. 2B, and FIG. 2C, the connector unit 30 may move between a holding position and a release position. The holding position may be a position where the connector unit 30 is arranged in the second arrangement space 12 of the terminal body 10, and held in place by the cover unit 20 in the closed position. The release position may be a position where the connector unit 30 is not arranged in the second arrangement space 12. If the first arrangement space 11 and the second arrangement space 12 partially overlap with each other, at least a portion of the connector unit 30, such as the USB connector 31, may partially contact the cover unit 20 if arranged in the holding position. Accordingly, the cover unit 20 in the closed position may limit movement of the connector unit 30 and may correspond to the holding position of the connector unit 30. The open position of the cover unit 20 may release the connector unit 30 and permit the connector unit 30 to move from the holding position to the release position.

The connector unit 30 may be hinge-connected to the terminal body 10 to rotate in a first direction labeled as M3 and M4 between the holding position and the release position, as illustrated in FIG. 2A and FIG. 2B. The connector unit 30 may be arranged in the second arrangement space 12 in the holding position, and may not be arranged in the second arrangement space 12 in the release position. Also, as illustrated in FIG. 2C, the USB connector 31 may be position-adjustable relative to the terminal body 10, and the USB connector 31 of the connector unit 30 in the release position may rotate in a second direction. An axis of rotation of the second direction may be orthogonal to an axis of rotation of the first direction. Although not illustrated in detail, a hinge axis for the rotation in the first direction between the connector unit 30 and the terminal body 10 may guide a rotation range of the connector unit 30, and may also elastically maintain the connector unit 30 in the release position. However, the connector unit 30 may not be limited to the above-described embodiment, and a structure of the connector unit 30 may vary, for example, the connector unit 30 may slide on the terminal body 10, similar to the cover unit 20, from the holding position to the release position.

Detailed descriptions of the hinge axis for rotation of the connector unit 30 in the first direction and the hinge axis for rotation in the second direction will be omitted herein since such descriptions are well-known to those skilled in the related art.

As illustrated in FIG. 3, the guide unit 40 may guide the cover unit 20 to move into and be held in the open position, and may guide the cover unit 20 to move to the closed position in conjunction with the movement of the connector unit 30 towards the second arrangement space 12. The guide unit 40 may guide one of the cover unit 20 and the connector unit 30 in conjunction with movement of the other. For this, the guide unit 40 may include a first guide unit 50 and a second guide unit 60 as illustrated in FIG. 3, FIG. 4, FIG. 5, FIG. 6, and FIG. 7. The first guide unit 50 and the second guide unit 60 may operate in conjunction with each other as explained below with reference to FIG. 3, FIG. 4, FIG. 5, FIG. 6, and FIG. 7.

The first guide unit 50 may guide the sliding movement of the cover unit 20 in the M1 and M2 directions. For this, the first guide unit 50 may include a rail 51, a frame 52, and an elastic body 55, as illustrated in FIG. 3 and FIG. 4.

The rail 51 may be arranged in the terminal body 10, and may extend in the M1 and M2 directions. A pair or more of rails 51 may be used according to an exemplary embodiment of the present invention, and the number of rails 51 may be selected according to a size of the terminal body 10 and available mounting locations of the rails 51 on the terminal body 10.

The frame 52 may be engaged with the cover unit 20, and slides on the rails 51 in conjunction with the sliding movement of the cover unit 20 as illustrated in FIG. 4 and FIG. 5. Here, as illustrated in FIG. 4 and FIG. 7, the frame 52 may include a sliding protrusion 53 that may be inserted in a rail 51. If a pair of rails 51 is used, a pair of sliding protrusions 53 may be arranged to correspond to the positions of the pair of rails 51. The frame 52 may be engaged with the cover unit 20 by one or more screws S.

The elastic body 55 may be arranged between the frame 52 and the terminal body 10, and may provide a force to pull the cover unit 20 into the closed position from the open position. The elastic body 55 may include one or more tension springs. The tension springs may be arranged at opposite ends of the frame 52 and the terminal body 10. The one end of one elastic body 55 may be held by a loop ring 54 arranged in the frame 52, and another end of the elastic body 55 may be connected to the terminal body 10 by a screw S. When the cover unit 20 is released from the open position as described below, the elastic body 55 may pull the cover unit 20 toward or into the closed position. A sliding speed of the cover unit 20 from the open position to the closed position may be controlled by selecting an appropriate elasticity of the elastic body 55.

The elastic body 55 is not limited to a tension spring, and another component that may restore the cover unit 20 from the closed position to the open position, such as a torsion spring, may be selected as the elastic body 55.

The second guide unit 60 may hold the cover unit 20 in the open position, and may release the cover unit 20 from the open position in conjunction with a movement of the connector unit 30. For this, the second guide unit 60 may include a pressure body 61, an interlocking rail 65, and a moving jaw 66 as illustrated in FIG. 3, FIG. 4, FIG. 5, FIG. 6, and FIG. 7. Also, the second guide unit 60 may rotate the connector unit 30 in the first direction, illustrated as the M3 and M4 directions in FIGS. 2A and 2B.

As illustrated in FIG. 6A, FIG. 6B, FIG. 7A, and FIG. 7B, the pressure body 61 may be move in a forward or backward direction relative to a facing direction of the cover unit 20. A portion of the pressure body 61 may protrude towards the arrangement portion where the first arrangement space 11 and the second arrangement space 12 overlap with each other, and the pressure body 61 may be in partial contact with the connector unit 30 if the connector unit 30 is arranged in the second arrangement space 12. The pressure body 61 may include a guide groove 62 corresponding to a guide projection 13 protruding from the terminal body 10 in the forward or backward direction relative to a facing direction of the cover unit 20, and thus movement forward and backward may be guided. Also, a range of movement backward (away from a facing direction of the cover unit 20) may be limited by a backward support 63 which is fastened by the screw S to the terminal body 10. Here, a pressure spring 64 may be mounted between the pressure body 61 and the backward support 63 as illustrated in FIG. 3 and FIG. 6. The pressure spring 64 may elastically support the pressure body 61 in the forward direction (toward a facing direction of the cover unit 20).

As described above with reference to FIGS. 6A and 6B, the cover unit 20 arranged in the closed position covers the USB connector 31, which is a portion of the connector unit 30. Thus, the cover unit 20 holds the connector unit 30 in the second arrangement space 12.

As illustrated in FIG. 3, FIG. 4, FIG. 5, FIG. 6, FIG. 7A, and FIG. 7B, an interlocking rail 65 may be arranged on the frame 52 to elastically support the pressure body 61 in the backward direction (away from the cover unit 20). Specifically, a pair of interlocking rails 65 may contact a portion of the pressure body 61, and the pair of interlocking rails 65 may enable the pressure body 61 to selectively move forward/backward according to the sliding movement of the frame 52. Accordingly, the interlocking rails 65 may selectively press the pressure body 61 in conjunction with the movement of the cover unit 20.

Figure 7A:
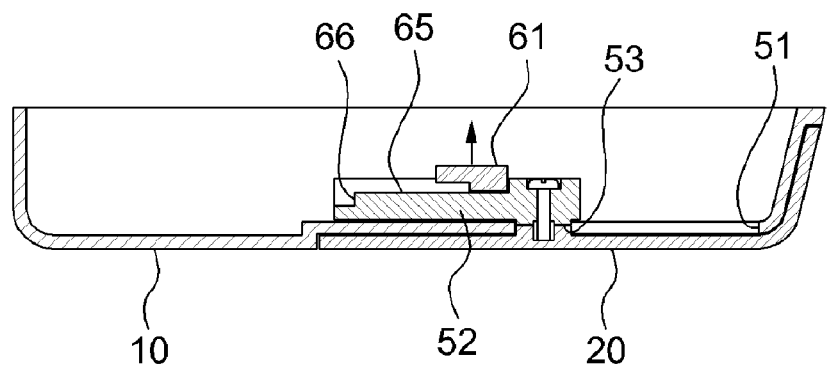
FIG. 7A is a cross-sectional view of a wireless communication terminal along axis VII-VII of FIG. 4, if a cover unit is in an closed position.
Figure 7B:
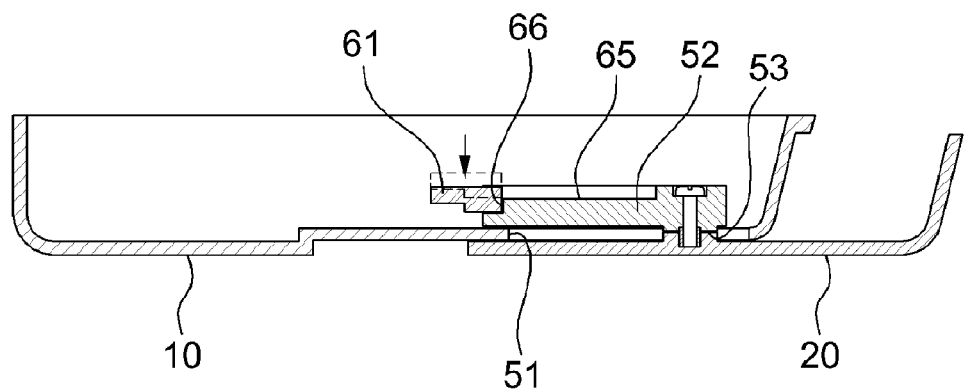
FIG. 7B is a cross-sectional view of a wireless communication terminal along axis VII-VII of FIG. 4, if a cover unit is in an open position.

As illustrated in FIGS. 7A and 7B, the moving jaw 66 may have a graduated step relative to the height of the interlocking rails 65, in a rear portion of the pair of interlocking rails 65 based on the M1 direction. Thus, if the cover unit 20 moves from the closed position to the open position, a backward pressure on the pressure body 61 may be released. That is, the contact between the interlocking rails 65 and the pressure body 61 may be released and the pressure body 61 may move forward toward the cover unit 20 facing direction to contact the moving jaw 66. Since the moving jaw 66 may be arranged in the rear portion of the interlocking rails 65, the moving jaw 66 may be arranged in a location where the sliding movement of the cover unit 20 towards the open position ends. Further, because of the steps of the moving jaw 66, the pressure body 61 moves forward to engage the moving jaw 66, and may prohibit the cover unit 20 and frame 52 from sliding back toward the closed position.

Further, since the connector 30 may be in the holding position when the cover unit 20 is slid toward the open position, the contact between the interlocking rails 65 and the pressure body 61 is released in conjunction with the sliding movement of the frame 52 towards the open position when the pressure body 61 moves forward to engage the moving jaw 66 according to pressure of the pressure spring 64. This forward motion of the pressure body 61 may release the connector unit 30 from the holding position. Therefore, the connector unit 30 may be more easily moved into the release position by rotating in the first direction based on the hinge axis, and thereby may protrude from terminal body 10.

Also, as illustrated in FIG. 7B, the moving jaw 66 on the frame 52 may function as a stopper to hold the cover unit 20, since the moving jaw 66 may engage a portion of the pressure body 61 once the cover unit 20 moves to the open position. That is, the elastic body 55 may pull the cover unit 20 towards the closed position, but the engagement between the moving jaw 66 and the pressure body 61 may prohibit the cover unit 20 from returning to the closed position, and instead may remain in the open position. According to the above-described embodiment, a distance of movement of the cover unit 20 towards the open position may be controlled by a location where the moving jaw 66 is arranged relative to the interlocking rails 65.

Since the wireless communication terminal 1 may be a terminal which is capable of being connected to a computer and provides a wireless Internet connectivity, although it has been described that the guide unit 40 may interoperate with the cover unit 20 and the connector unit 30, it may not be limited thereto. For example, if the wireless communication terminal 1 is a personal communication services (PCS) mobile phone, the guide unit 40 may interoperate with a cover unit and a microphone unit.

An operation of the wireless communication terminal 1 will now be described in more detail with reference to FIG. 1, FIG. 2, FIG. 3, FIG. 4, FIG. 5, FIG. 6, and FIG. 7.

If both the cover unit 20 and the connector unit 30 are used, while the cover unit 20 and the connector unit 30 are arranged in the first arrangement space 11 and the second arrangement space 12 in the terminal body 10, respectively, as illustrated in FIG. 1, the cover unit 20 may slide towards the open position in the M1 direction as illustrated in FIGS. 2A and 2B. The cover unit 20 may be located exteriorly in comparison to the connector unit 30 based on the terminal body 10. The frame 52 connected to the cover unit 20 may slide together with the cover unit 20 in the M1 direction, as illustrated in FIG. 5 and FIG. 6. The frame 52 may include the sliding protrusions 53 inserted in the rails 51 arranged in the terminal body 10, as illustrated in FIGS. 7A and 7B. Accordingly, the sliding movement of the frame 52 may be guided by the rails 51. Also, the elastic body 55 connected with the frame 52 may be extended in the M1 direction, and may impart a tensile force to the frame 52.

Figure 6A:
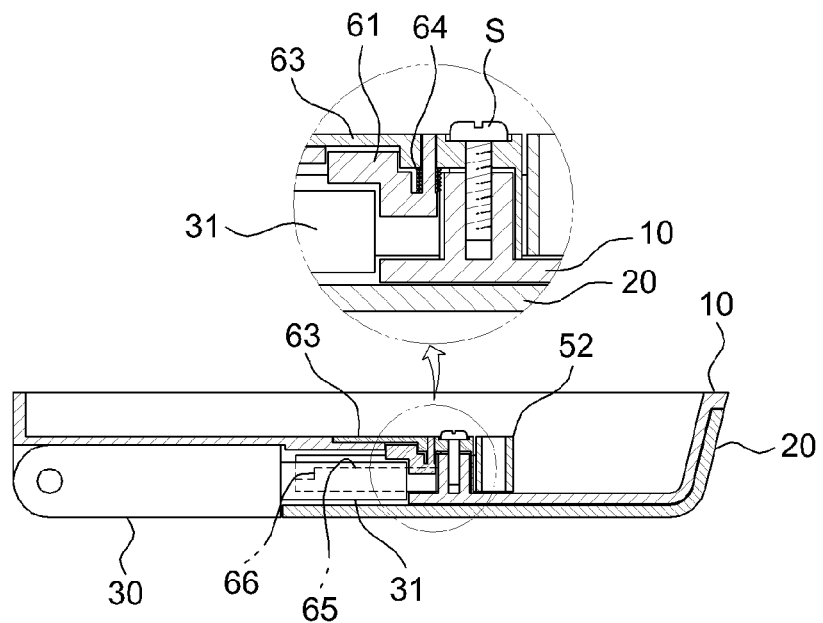
FIG. 6A is a cross-sectional view of a wireless communication terminal along an axis VI-VI of FIG. 4, if a cover unit is in a closed position.
Figure 6B:
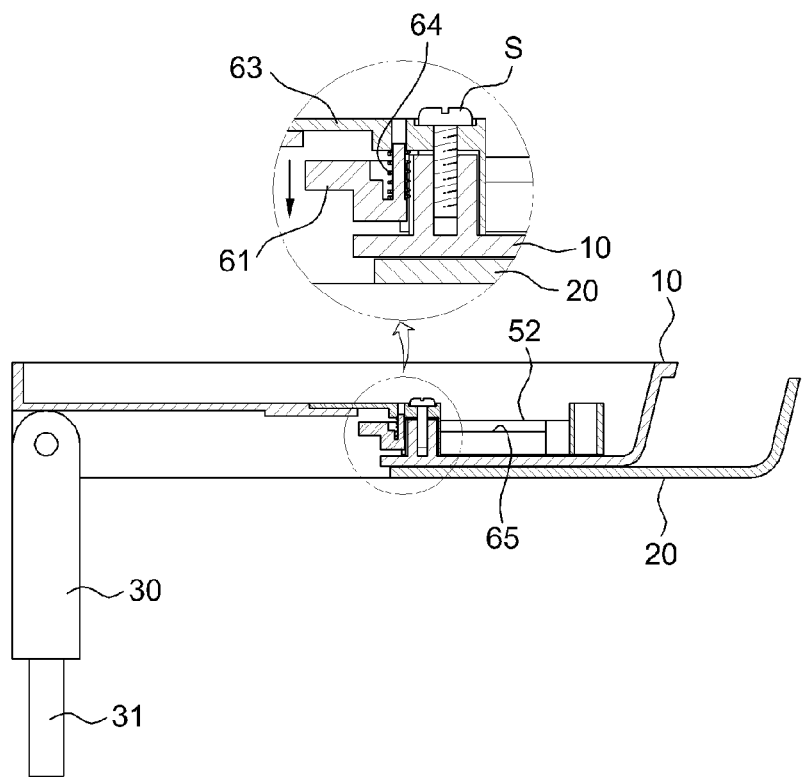
FIG. 6B is a cross-sectional view of a wireless communication terminal along an axis VI-VI of FIG. 4, if a cover unit is in an open position.

As illustrated in FIGS. 7A and 7B, as the frame 52 connected to the cover unit 20 moves to the open position in the M1 direction, the pressure body 61, which is in contact with the interlocking rails 65 of the frame 52 and located in a rear portion, may be released from the interlocking rails and engage the moving jaw 66 by moving toward the cover unit 20 as a result of the pressure spring 64. Specifically, the contact, illustrated in FIG. 7A, between the pressure body 61 and the interlocking rails 65 may be released, and the pressure body 61 may move forward due to the pressure spring 64 as illustrated in FIG. 6B and FIG. 7B. The pressure body 61 moving forward may release the connector unit 30 from the holding position. Also, the cover unit 20 may be held in the open position by the pressure body 61 engaging with the moving jaw 66. If the connector unit 30 held in the holding position is released by the cover unit 20 moving to the open position and the pressure body 61 moving forward, the connector unit 30 may protrude towards the release position according to the rotation of the hinge axis of the connector unit 30. Accordingly, when a user rotates the connector unit 30 protruding towards the release position in the M3 direction, the connector unit 30 may be more easily connected to a computer.

Then, the connector unit 30 may rotate towards the holding position in the M4 direction as illustrated in FIG. 2A and FIG. 2B, and thereby may be accommodated in the second arrangement space 12. In this instance, the connector unit 30 is mostly or completely arranged in the second arrangement space 12 to prevent the connector unit 30 from protruding from the terminal body 10. This may press the pressure body 61 backwards, away from the cover unit 20 facing direction. Accordingly, the engagement between the pressure body 61 and the moving jaw 66 may be released, and the cover unit 20 held in the open position may be released. Because the elastic body 55 is in an extended position, the elastic body's contraction may cause the cover unit 20 to slide toward the closed position in the M2 direction, illustrated in FIG. 2A, back into the first arrangement space 11.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A wireless communication terminal, comprising:
    a terminal body;
    a cover unit arranged to move on the terminal body;
    a connector unit arranged to move on the terminal body;
    a first guide unit to guide the cover unit to move from a closed position to an open position; and
    a second guide unit to hold the cover unit in the open position, and to release the cover unit held in the open position in conjunction with movement of the connector unit wherein the first guide unit comprises a first rail on the terminal body, a frame to move on the first rail in conjunction with a movement of the cover unit and an elastic body connected to the frame to provide a force to move the cover unit to the closed position.

2. The wireless communication terminal of claim 1, wherein the second guide unit comprises:
    a pressure body to contact the connector unit arranged in the terminal body if the cover unit is moved to the open position;
    an interlocking rail arranged on the frame to support the pressure body if the cover unit is in the closed position; and
    a moving jaw arranged adjacent to the interlocking rail, the moving jaw to engage the pressure body if the cover unit is in the open position.

3. The wireless communication terminal of claim 1, wherein the connector unit is rotatable in a first direction about the terminal body, and a portion of the connector unit is rotatable in a second direction having an axis of rotation that is orthogonal to an axis of rotation of the first direction.

4. The wireless communication terminal of claim 1, wherein an intenna is arranged in the cover unit.

5. The wireless communication terminal of claim 1, wherein the connector unit comprises a Universal Serial Bus (USB) connector.

6. A wireless communication terminal, comprising:
    a terminal body;
    a cover unit arranged to move on the terminal body;
    a connector unit arranged to move from a first acceptance space on the terminal body to a release position; and
    a guide unit to guide the cover unit to move from a closed position to an open position, and to hold the cover unit in the closed position and the open position, the closed position being a position where the cover unit covers the connector unit in the first acceptance space, and the open position being a position where the connector unit is uncovered wherein the guide unit comprises: a first guide unit comprising a first rail on the terminal body, a frame to move on the first rail in conjunction with a movement of the cover unit and an elastic body connected to the frame to provide a force to move the cover unit to the closed position; and a second guide unit comprising a pressure body to contact the connector unit in the first acceptance space, an interlocking rail arranged on the frame to support the pressure body if the cover unit is in a closed position, and a moving jaw arranged adjacent to the interlocking rail to engage the pressure body if the cover unit is in the open position.

7. The wireless communication terminal of claim 6, wherein the cover unit slides on the terminal body from the closed position to the open position to release the connector unit, the connector unit is rotatable in a first direction about a first axis of rotation in conjunction with movement of the cover unit, and a portion of the connector unit is rotatable in a second direction about a second axis of rotation.

8. The wireless communication terminal of claim 6, wherein an intenna is arranged in the cover unit.

9. The wireless communication terminal of claim 6, wherein the connector unit comprises a Universal Serial Bus (USB) connector.

10. A wireless communication terminal, comprising:
a terminal body comprising an arrangement portion;
a connector unit hinge-connected to the terminal body, the connector unit to move into and out of the arrangement portion;
a cover unit to move on the terminal body, the cover unit to partially cover the arrangement portion if the cover unit is in a closed position; and
a guide unit to hold the cover unit in an open position, and to guide the cover unit to the closed position in conjunction with a movement of the connector unit into the arrangement portion wherein the guide unit comprises: a first rail on the terminal body, a frame to move on the first rail in conjunction with a movement of the cover unit and an elastic body connected to the frame to provide a force to move the cover unit to the closed position; a pressure body to contact the connector unit if the connector unit is arranged in the first arrangement portion; an interlocking rail arranged on the frame to support the pressure body if the cover unit is in a closed position, and a moving jaw arranged adjacent to the interlocking rail to engage the pressure body if the cover unit is in the open position.

11. The wireless communication terminal of claim 10, wherein if the cover unit is in the closed position, the cover unit covers at least a portion of the connector unit to limit movement of the connector unit.

12. The wireless communication terminal of claim 10, wherein the connector unit rotates about a hinge axis and protrudes from the arrangement portion if the cover unit moves to the open position.

13. The wireless communication terminal of claim 10, wherein an intenna is arranged in the cover unit.

14. The wireless communication terminal of claim 10, wherein the connector unit comprises a Universal Serial Bus (USB) connector.

* * * * *